United States Patent
Sun et al.

(10) Patent No.: US 11,917,867 B2
(45) Date of Patent: Feb. 27, 2024

(54) DISPLAY PANEL AND DISPLAY DEVICE FOR BOTH 2D AND 3D DISPLAY, AND METHOD FOR MANUFACTURING THE SAME

(71) Applicant: BOE TECHNOLOGY GROUP CO., LTD., Beijing (CN)

(72) Inventors: Yanliu Sun, Beijing (CN); Yujie Liu, Beijing (CN); Ge Shi, Beijing (CN); Zheng Fang, Beijing (CN); Jiahui Han, Beijing (CN); Yuyao Wang, Beijing (CN); Song Yang, Beijing (CN); Shiyu Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 370 days.

(21) Appl. No.: 16/939,239

(22) Filed: Jul. 27, 2020

(65) Prior Publication Data

US 2021/0193763 A1 Jun. 24, 2021

(30) Foreign Application Priority Data

Dec. 20, 2019 (CN) .......................... 201911329789.4

(51) Int. Cl.
*H10K 59/124* (2023.01)
*H10K 50/858* (2023.01)
(Continued)

(52) U.S. Cl.
CPC ......... *H10K 59/124* (2023.02); *H10K 50/858* (2023.02); *H10K 59/123* (2023.02);
(Continued)

(58) Field of Classification Search
CPC ............. H01L 27/3258; H01L 27/3248; H01L 51/5275; H01L 27/3211; H01L 27/322; H01L 2227/323
(Continued)

(56) References Cited

U.S. PATENT DOCUMENTS

2005/0040756 A1* 2/2005 Winters .............. H01L 51/5265
313/504
2007/0031988 A1* 2/2007 Agranov ........... H01L 27/14625
257/E31.127
(Continued)

FOREIGN PATENT DOCUMENTS

CN 104898292 A 9/2015
CN 105739108 A 7/2016
(Continued)

OTHER PUBLICATIONS

First Office Action for CN Patent Application No. 201911329789.4 dated Feb. 22, 2022.

*Primary Examiner* — Xia L Cross
(74) *Attorney, Agent, or Firm* — XSENSUS LLP

(57) ABSTRACT

Provided are a display panel and a method for manufacturing the same, a display device and a control method of the same related to the technical field of display. The display panel includes a base substrate; a pixel defining layer arranged on the base substrate and configured to define a plurality of sub-pixels, at least one sub-pixel of the plurality of sub-pixels includes a plurality of sub-pixel-units; and each sub-pixel-unit of the plurality of sub-pixels includes an anode, a light emitting layer, and a cathode that are stacked, and anodes of adjacent sub-pixel-units in a same sub-pixel are insulated from each other and are apart from the base substrate for different distances.

20 Claims, 11 Drawing Sheets

(51) Int. Cl.
*H10K 59/123* (2023.01)
*H10K 59/35* (2023.01)
*H10K 59/38* (2023.01)
*H10K 59/12* (2023.01)

(52) U.S. Cl.
CPC ......... *H10K 59/1201* (2023.02); *H10K 59/35* (2023.02); *H10K 59/38* (2023.02)

(58) Field of Classification Search
USPC .......................................................... 257/72
See application file for complete search history.

(56) References Cited

U.S. PATENT DOCUMENTS

| 2017/0155891 | A1 | 6/2017 | Hu | |
| 2019/0123306 | A1* | 4/2019 | Liang | G02B 3/0043 |
| 2019/0198575 | A1 | 6/2019 | Liu | |
| 2019/0371866 | A1* | 12/2019 | Kim | H01L 27/322 |
| 2020/0203384 | A1* | 6/2020 | Huo | H01L 27/1262 |

FOREIGN PATENT DOCUMENTS

| CN | 105867011 A | 8/2016 |
| CN | 109686768 A | 4/2019 |

* cited by examiner

DISPLAY PANEL AND DISPLAY DEVICE FOR BOTH 2D AND 3D DISPLAY, AND METHOD FOR MANUFACTURING THE SAME

CROSS-REFERENCE TO RELATED APPLICATION

This application claims the benefit of and priority to Chinese Patent Application No. 201911329789.4, filed on Dec. 20, 2019, where the entire content thereof is incorporated herein by reference.

TECHNICAL FIELD

The present disclosure relates to a display panel and a method for manufacturing the same, a display device, and a control method thereof.

BACKGROUND

Due to various advantages, such as wide color gamut, fast response, wide viewing angle, high contrast, etc., organic light-emitting devices (OLED) have been widely used in the display field. However, OLED display devices manufactured using fine metal shadowmask (FMM) technology have a lower resolution due to the manufacturing accuracy of FMM technology.

SUMMARY

At least one embodiment of the present disclosure provides a display panel, including: a base substrate; a pixel defining layer arranged on the base substrate, the pixel defining layer is configured to define a plurality of sub-pixels, at least one sub-pixel of the plurality of sub-pixels includes a plurality of sub-pixel-units; and each sub-pixel-unit of the plurality of sub-pixels includes an anode, a light emitting layer, and a cathode that are stacked, and anodes of adjacent sub-pixel-units in a same sub-pixel are insulated from each other and apart from the base substrate for different distances.

For example, in the display panel provided by at least one embodiment of the present disclosure, the plurality of sub-pixel-units include a first sub-pixel-unit and a second sub-pixel-unit that are adjacent, the first sub-pixel-unit includes first anodes, and the second sub-pixel-unit includes a second anode, and sidewalls of the first anode and sidewalls of the second anode are separated by an insulating layer.

For example, in the display panel provided by at least one embodiment of the present disclosure, a spacing between orthographic projection of the first anode on the base substrate and orthographic projection of the second anode on the base substrate is less than or equal to zero.

For example, in the display panel provided by at least one embodiment of the present disclosure, the display panel further includes a plurality of thin film transistors disposed between the base substrate and the anodes and a flat layer covering the thin film transistors. The first anode is electrically connected to the thin film transistor through a first via penetrating the flat layer, and the second anode is electrically connected to the thin film transistor through a second via penetrating the flat layer.

For example, in the display panel provided by at least one embodiment of the present disclosure, the insulating layer is at least partially located between the flat layer and the second anode, and the second anode penetrates the insulating layer to be electrically connected to the thin film transistor.

For example, in the display panel provided by at least one embodiment of the present disclosure, the display panel includes a light emitting layer disposed on a side of the anode facing away from the base substrate, and light emitting layers of different sub-pixel-units in the same sub-pixel are continuously disposed.

For example, in the display panel provided by at least one embodiment of the present disclosure, the display panel includes cathodes disposed on a side of the light emitting layer facing away from the base substrate, and cathodes of different sub-pixel-units in the same sub-pixel are continuously disposed.

For example, in the display panel provided by at least one embodiment of the present disclosure, light emitting layers of the plurality of sub-pixel-units are configured to emit white light, and a color filter layer is provided on a light emitting side of the display panel; or the light emitting layers of the plurality of sub-pixel-units are configured to emit red light, green light, and blue light, respectively.

At least one embodiment of the present disclosure also provides a display device including the above-mentioned display panel, the display device further includes a lens array disposed on the light emitting side of the display panel. The lens array includes a plurality of lens units, the plurality of lens units has a one-to-one correspondence with the plurality of sub-pixel-units in at least one direction.

For example, in the display device provided by at least one embodiment of the present disclosure, the plurality of lens units has a one-to-one correspondence with the plurality of sub-pixel-units.

For example, in the display device provided by at least one embodiment of the present disclosure, the plurality of lens units is ball lenses.

For example, in the display device provided by at least one embodiment of the present disclosure, light emitting layers of the plurality of sub-pixel-units are located substantially on focal planes of the lens units corresponding thereto.

For example, in the display device provided by at least one embodiment of the present disclosure, distances H between the light emitting layers of the plurality of sub-pixel-units and the corresponding lens units are: $H = n' \times f$, where $n'$ is an equivalent refractive index of a medium between the light emitting layer and the corresponding lens unit; f is a focal length of the lens unit, and f is:

$$\frac{1}{f} = (n-1)\left[\frac{1}{R1} - \frac{1}{R2} + \frac{(n-1)d}{n \cdot R1 \cdot R2}\right],$$

where n is a refractive index of the lens unit, R1 and R2 are radii of curvature of two curved surfaces of the lens unit, respectively, d is the thickness of the lens unit.

For example, in the display device provided by at least one embodiment of the present disclosure, orthographic projections of the lens units on the base substrate substantially coincides with orthographic projections of the corresponding sub-pixels.

For example, in the display device provided by at least one embodiment of the present disclosure, the plurality of lens units are round lenses, and correspond to the plurality of sub-pixels in one-to-one correspondence.

For example, in a display device provided by at least one embodiment of the present disclosure, the display device further includes a color filter layer disposed on the light emitting side of the display panel, and the lens array is located on a side of the color filter layer away from the base substrate.

For example, in a display device provided by at least one embodiment of the present disclosure, the display device further includes a color filter layer disposed on the light emitting side of the display panel, and the lens array is located on a side of the color filter layer close to the base substrate, and a buffer layer is disposed between the lens array and the color filter layer.

For example, in a display device provided by at least one embodiment of the present disclosure, the sub-pixels include a*b of the sub-pixel-units, where a is a number of sub-pixel-units arranged in a second direction, and b is a number of sub-pixel-units arranged in a first direction, and a is equal to b.

At least one embodiment of the present disclosure further provides a control method of a display device, including: providing a same electrical signal for all sub-pixel-unit units in each sub-pixel to enable a display panel to implement 2D display; and providing different electrical signals for all sub-pixel-unit units in each sub-pixel to enable the display panel to implement 3D display.

At least one embodiment of the present disclosure further provides a method for manufacturing a display panel, including: providing a base substrate; and manufacturing a pixel defining layer on the base substrate, and defining a plurality of sub-pixels by the pixel defining layer, at least one sub-pixel of the plurality of sub-pixels includes a plurality of sub-pixel-units; and each sub-pixel-unit of the plurality of sub-pixels includes an anode, a light emitting layer, and a cathode that are stacked, and anodes of adjacent sub-pixel-units in a same sub-pixel are insulated from each other and apart from the base substrate for different distances.

For example, in the method for manufacturing a display panel provided by at least one embodiment of the present disclosure, that each sub-pixel-unit of the plurality of sub-pixels includes an anode, a light emitting layer, and a cathode that are stacked, and anodes of adjacent sub-pixel-units in a same sub-pixel are insulated from each other and apart from the base substrate for different distances includes: providing first anodes; providing insulating layer material and second anode material; coating photoresist to form photoresist retention region and photoresist removal region; performing a first etching process under protection of the photoresist to etch away the second anode material corresponding to the photoresist removal region; performing a second etching process under the protection of the photoresist to etch away the insulating layer material corresponding to the photoresist removal region; and forming an insulating layer and second anodes.

BRIEF DESCRIPTION OF THE DRAWINGS

The accompanying drawings, which are incorporated in the specification and constitute a part of the specification, show exemplary embodiments of the present disclosure. The drawings along with the specification explain the principles of the present disclosure. It is apparent that the drawings in the following description show only some of the embodiments of the present disclosure, and other drawings may be obtained by those skilled in the art without departing from the drawings described herein.

REFERENCE NUMBER

1—display device; 10—display panel; 110—substrate; 111—flat layer; 112—insulating layer; 113—encapsulation layer; 114—polarizer; 115—cathode; 116—pixel defining layer; 117—light shielding layer; 121—first via; 122—second via; 130—anode; 131—first anode; 132—second anode; 140—opening region; 150—layer where a thin film transistor is located; 151—thin film transistor; 160—color filter layer; 161—red filter unit; 162—green filter unit; 163—blue filter unit; 170—light emitting layer; 171—red light OLED; 172—green light OLED; 173—blue light OLED; 180—lens array; 181—lens unit; 190—buffer layer; 1001—substrate; 1002—imprinting template; 1003—recess structure; 1004—protrusion structure.

DETAILED DESCRIPTION

To make objectives, technical solutions, and advantages of embodiments of the present disclosure more clear, the technical solutions of the embodiments of the present disclosure will be described clearly and completely in conjunction with drawings of the embodiments of the present disclosure. It is apparent that the described embodiments are a part of the embodiments of the present disclosure, but not all the embodiments. Based on the described embodiments of the present disclosure, all other embodiments obtained by a person of ordinary skill in the art without creative efforts fall within the protection scope of the present disclosure.

Unless otherwise defined, technical or scientific terms used in the present disclosure shall have general meanings understood by a person of ordinary skill in the art to which the present disclosure belongs to. The terms "first," "second," and similar words used in the present disclosure do not indicate any order, quantity, or importance, but are only used to distinguish different components. Similar words, such as "include" or "comprise," mean that elements or objects appearing before the word cover elements or objects listed after the word and their equivalents, but do not exclude other elements or objects. "Up," "down," "left," "right," etc. are only used to indicate the relative positional relationship. When an absolute position of the described object changes, the relative positional relationship may also change accordingly.

In the related art, a pixel defining layer is generally used to define a light emitting region of each pixel. Therefore, a size of the pixel defining layer limits a reduction in pixel pitch, which is not conducive to improving PPI (Pixels Per Inch) of a display panel.

Figure 1:
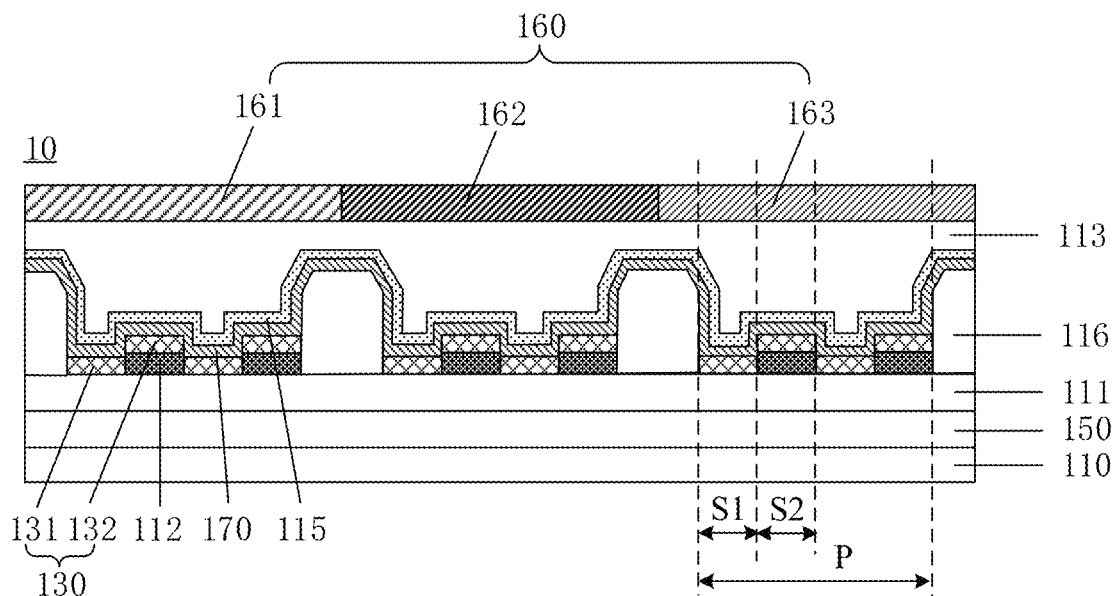
FIG. 1 is a cross-sectional view of a display panel provided by at least one embodiment of the present disclosure.
Figure 2:
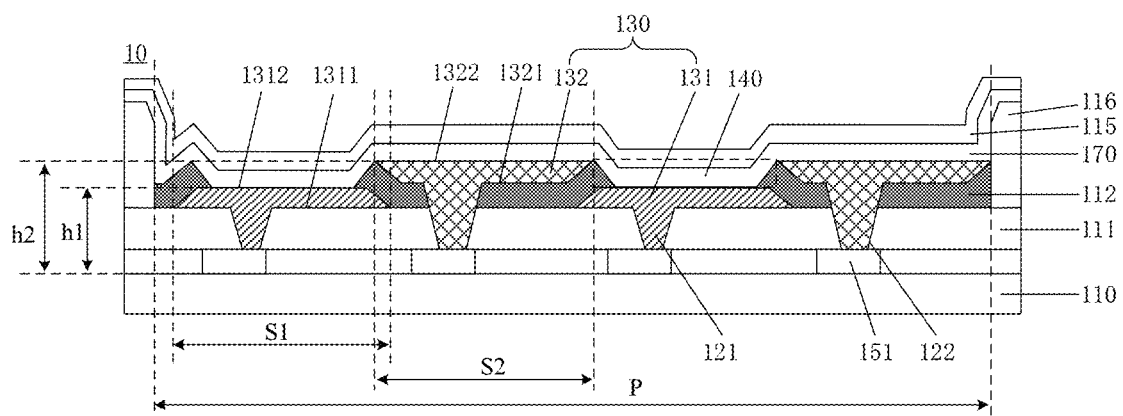
FIG. 2 is a partial enlarged view of the display panel shown in FIG. 1.

Based on this, embodiments of the present disclosure provide a display panel that can reduce the pixel pitch of the display panel. As shown in FIGS. 1 and 2, the display panel 10 includes a base substrate 110, a pixel defining layer 116 provided on the base substrate 110 and configured to define a plurality of sub-pixels P. Each sub-pixel P is configured to emit a monochromatic light.

At least one sub-pixel P of the plurality of sub-pixels P includes a plurality of sub-pixel-units S.

Each sub-pixel-unit S of the plurality of sub-pixels P includes an anode 130, a light emitting layer 170, and a cathode 115 that are stacked. In the same sub-pixel P, the anodes of adjacent sub-pixel-units S are insulated from each other and apart from the base substrate for different distances.

FIG. 2 is an enlarged view of one sub-pixel region in FIG. 1. It should be understood that the anodes of adjacent sub-pixel-units being insulated from each other means that the anodes of adjacent sub-pixel-units are not electrically connected. The anodes of adjacent sub-pixel-units may be insulated from each other by being disconnected from each other, or be insulated from each other by disposing an insulating layer between the anodes of adjacent sub-pixel-units.

The anode 130 of each sub-pixel-unit S includes a first surface close to the base substrate and a second surface facing away from the base substrate. The anodes of adjacent sub-pixel-units being apart from the base substrate for different distances means that the first surfaces of the anodes of adjacent sub-pixel-units are apart from a surface of the base substrate for different distances, or that the second surfaces of the anodes of adjacent sub-pixel-units are apart from a surface of the base substrate for different distances.

The anode 130 of each sub-pixel-unit is connected to a separate thin-film transistor 151. Since the anodes of adjacent sub-pixel-units are insulated from each other due to different distances from the base substrate, an independently controlled driving of each sub-pixel-unit can be achieved. Therefore, there is no need to dispose the pixel defining layer between adjacent sub-pixel-units to separate adjacent sub-pixel-units apart. An area occupied by one sub-pixel-unit is only determined by the size of the thin film transistor corresponding to the sub-pixel-unit, thereby significantly reducing the spacing between adjacent sub-pixel-units. For the display panels with the same display area, the smaller the spacing between adjacent sub-pixel-units, the greater the number of sub-pixel-units that can be provided on the display panel, and the effect of improving the display PPI can be achieved.

Exemplarily, the distances between the anodes of the plurality of sub-pixel-units included in the same sub-pixel and the base substrate may be all different, so that the anodes of adjacent sub-pixel-units are insulated from each other. Alternatively, the plurality of sub-pixel-units included in the same sub-pixel are located at odd and even positions in sequence along a first direction and a second direction, the anodes of the plurality of sub-pixel-units at odd positions are apart from the base substrate for the same distance, the anodes of the plurality of sub-pixel-units at even positions are apart from the base substrate for the same distance, and the anodes of two adjacent sub-pixel-units (that is, one sub-pixel-unit is located at the odd position and the other sub-pixel-unit is located at even position) are apart from the base substrate for different distances, so that the anodes of adjacent sub-pixel-units are insulated from each other. In this way, all sub-pixel-units in the same sub-pixel can be separated from each other by setting only two types of distances between the anodes of sub-pixel-units and the base substrate, thereby avoiding excessive steps, reducing the thickness of the display panel, shortening a process flow, and reducing the difficulty of manufacturing. Optionally, as shown in FIG. 2, the plurality of sub-pixel-units includes a first sub-pixel-unit S1 and a second sub-pixel-unit S2 that are adjacent. The first sub-pixel-unit S1 includes a first anode 131, and the second sub-pixel-unit S2 includes a second anode 132, and a sidewall of the first anode and a sidewall of the second anode are separated by an insulating layer 112. By providing the insulating layer 112 to separate the first anode 131 of the first sub-pixel-unit S1 and the second anode 132 of the second sub-pixel-unit S2, a good insulation effect can be ensured. Therefore, a short circuit between the anodes of adjacent sub-pixel-units may be prevented while the spacing between adjacent sub-pixel-units is reduced. By adopting such structure, a pattern of the second anode and a pattern of the insulating layer may be simultaneously formed through one patterning process, thereby reducing the process flow and the production cost.

As shown in FIG. 2, the first anode 131 of the first sub-pixel-unit S1 includes a first surface 1311 close to the base substrate and a second surface 1312 facing away from the base substrate. The first surface 1311 of the first anode 131 refers to a surface of the anode 131 in contact with the flat layer 111. The second anode 132 of the second sub-pixel-unit S2 includes a first surface 1321 close to the base substrate and a second surface 1322 facing away from the base substrate. The first surface 1321 of the second anode 132 refers to a surface of the second anode 132 in contact with the insulating layer 112. The distance between the second surface 1312 of the first anode 131 and the surface of the base substrate 110 is h1, and the distance between the second surface 1322 of the second anode 132 and the surface of the base substrate 110 is h2. As an example, h2=h1+t1, m where t1 is the thickness of the insulating layer 112.

Optionally, a spacing between an orthographic projection of the first anode 131 of the first sub-pixel-unit S1 on the base substrate and an orthographic projection of the second anode 132 of the second sub-pixel-unit S2 on the base substrate is less than or equal to 0, that is, the orthographic projection of the first anode 131 of the first sub-pixel-unit S1 on the base substrate and the orthographic projection of the second anode 132 of the second sub-pixel-unit S2 on the base substrate may be directly adjacent, or may partially overlap. The second surface 1312 of the first anode 131 facing away from the base substrate includes a flat surface and side walls, and the flat surface is substantially parallel to the base substrate. The embodiments of the present disclosure do not limit an angle between the side walls of the first anode and the base substrate. Optionally, as shown in FIG. 2, an angle between a plane where the side walls of the first anode are located and a plane where the base substrate is located is an acute angle. It can be understood that the smaller the angle between the side walls of the first anode and the base substrate, the smoother a slope at a position corresponding to the side walls of the first anode is. In this way, when other film layers are formed above the first anode subsequently, defects such as cracks are prevented at corresponding positions of the side walls in these film layers, thereby improving the quality of the film layers.

After the pattern of the first anode 131 is formed, the insulating layer 112 is formed, and the insulating layer is provided with an opening region 140 expose a portion of the second surface 1312 of the first anode 131 to realize the electrical connection of subsequent functional film layers and the first anode 131. An area of an orthographic projection of the opening region 140 on the base substrate is less than or equal to an area of the orthographic projection of the first anode 131 on the base substrate. Optionally, the area of the orthographic projection of the opening region 140 on the base substrate is less than or equal to an area of an orthographic projection of the flat surface of the first anode 131 on the base substrate, so as to improve the flatness of a contact surface between the subsequent functional film layers and the first anode 131 and improve the uniformity of light emission.

The second anode 132 of the second sub-pixel-unit S2 is disposed on the insulating layer 112. The second anode 132 is formed with an inclined surface at a position corresponding to the side wall of the first anode. Accordingly, an angle between a plane where the side wall of the second anode 132 is located and a plane where the base substrate is located is also an acute angle. The orthographic projection of the side wall of the second anode 132 on the base substrate and the orthographic projection of the side wall of the first anode 131 on the base substrate partially overlap, so that the spacing between adjacent sub-pixel-units is further reduced. The portion of the second surface 1312 of the first anode 131, exposed by the opening region 140 of the insulating layer, is defined as a light emitting region of the first sub-pixel-unit S1, and an upper surface of the second anode 132 is defined as a light emitting region of the second sub-pixel-unit S2. The spacing between the light emitting regions of the first sub-pixel-unit S1 and the second sub-pixel-unit S2 may be reduced by making the orthographic projection of the side wall of the second anode 132 on the base substrate partially overlap with the orthographic projection of the side wall of the first anode 131 on the base substrate. It can be understood that, by adjusting the area of the opening region, the spacing between the light emitting region of the first sub-pixel-unit S1 and the light emitting region of the second sub-pixel-unit S2 may be zero, that is, the continuity of the light emitting regions may be achieved. For example, the spacing between the light emitting regions of the first sub-pixel-unit S1 and the second sub-pixel-unit S2 is less than or equal to zero.

Optionally, as shown in FIG. 1 and FIG. 2, the display panel includes a plurality of thin film transistors 151 disposed between the base substrate 110 and the anode 130 (in FIG. 1, 150 indicates the layer where the thin film transistor 151 is located) and a flat layer 111 covered on the thin film transistors 151. The first anode 131 is electrically connected to the thin film transistor 151 through a first via 121 penetrating the flat layer 111, and the second anode 132 is electrically connected to the thin film transistor 151 through a second via 122 penetrating the flat layer 111.

Exemplarily, the thin film transistor 151 may be an amorphous silicon thin film transistor, an oxide thin film transistor, an LTPS (low temperature polysilicon) thin film transistor, and other types of thin film transistors. The embodiments of the present disclosure do not limit the types of thin film transistor.

The thin film transistor includes a gate, an active layer, a source, a drain, and the like. The source or drain of the thin film transistor is connected to the anode of the sub-pixel-unit, so as to control and drive the light emitting device by the thin film transistor.

The anode 130 of the sub-pixel-unit may be made of materials such as metals or transparent conductive oxides, such as Ag, ITO, IZO, ITO/Ag/ITO, etc. The materials of the first anode 131 and the second anode 132 may be the same or different.

The flat layer 111 covers the thin film transistors 151 and is used to flatten the surface of the thin film transistors to facilitate subsequent manufacturing of the light emitting device. For example, the flat layer may be made of an organic material or an inorganic material. The organic material includes polyimide material, acrylic material, etc. The inorganic material includes silicon oxide, silicon nitride, silicon oxynitride material, etc. The material and thickness of the layer are not limited by the embodiments of the present disclosure, as long as it can achieve good flatness and insulation effect.

Optionally, the insulating layer 112 is at least partially located between the flat layer 111 and the second anode 132, so that the distance h2 between the second anode 132 and the base substrate 110 and the distance h1 between the first anode 131 and the base substrate 110 are different. The second anode 132 also penetrates through the insulating layer 112 to be electrically connected to the thin film transistors 151. As can be seen from FIG. 2, in order to achieve the separation of the first anode 131 and the second anode 132, the second anode 132 is disposed on the insulating layer 112. Further, in order to realize the connection between the second anode 132 and the thin film transistors 151, the second via 122 needs to penetrate the insulating layer 112 and the flat layer 111.

The material of the insulating layer 112 may be an inorganic material, such as silicon oxide, silicon nitride, silicon oxynitride, etc. The embodiments of the present disclosure do not limit the material of the insulating layer, as long as it can achieve a good insulating effect.

Optionally, after the first anode 131 is manufactured, the insulating layer material is deposited on the entire surface, and then a patterning process for the insulating layer is performed, and the opening region 140 and the second via 122 are simultaneously formed in the same patterning step. Optionally, when the patterning process of the flat layer is performed, only the first via 121 is formed, and during the patterning process of the insulating layer, the second via 122 that penetrates the insulating layer 112 and the flat layer 111 is formed.

As shown in FIGS. 1 and 2, the display panel 10 further includes a light emitting layer 170 disposed on a side of the anode 130 facing away from the base substrate. Optionally, the light emitting layer is configured to emit white light. For example, a white light OLED may be used. The white light OLED may be formed by an entire-surface evaporation process. The manufacturing process is simple and the cost is low. A color filter layer 160 is provided on a light emitting surface of the white light OLED. The color filter layer includes a plurality of filter units. As shown in FIG. 1, the color filter layer 160 includes a red filter unit 161, a green filter unit 162, and a blue filter unit 163. The plurality of filter units has a one-to-one correspondence with the plurality of sub-pixels P. An orthographic projection of the filter unit on the base substrate covers an orthographic projection of its corresponding sub-pixel P on the base substrate. The filter units are used to convert the white light emitted by the white light OLED into light of different colors, so that each sub-pixel P emits the monochromatic light. According to different display requirements, different modes such as RGB, RGGB, RGBW and so on may be set. The color filter layer may use a color resist material, or a quantum dot material may be added to the color resist material to improve the color gamut and achieve a better display effect. It can be understood that since one sub-pixel P corresponds to a color filter unit of one color, the colors of light emitted by a plurality of sub-pixels are different, and the colors of light emitted by a plurality of sub-pixel-units S in the same sub-pixel P are the same. In the same sub-pixel, the light emitting layers of a plurality of sub-pixel-units are continuously arranged, and each sub-pixel-unit is controlled and driven by a separate thin film transistor, thereby achieving different display gray levels. The light emitting layers of different sub-pixels may be continuously arranged as shown in FIG. 1 or may be disconnected at the pixel defining layer 116.

Figure 3:
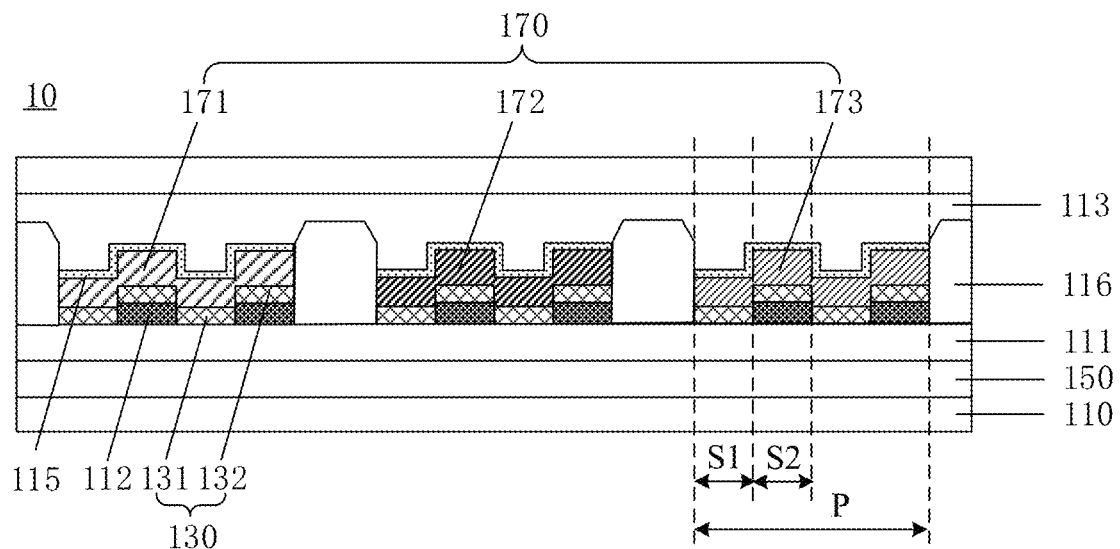
FIG. 3 is a cross-sectional view of a display panel provided by at least one embodiment of the present disclosure.

Optionally, as shown in FIG. 3, the light emitting layers 170 of the plurality of sub-pixels may be configured to emit different colors of light, respectively. For example, OLED materials that emit different colors of light may be used. For example, the light emitting layers 170 of a plurality of sub-pixels may be a red OLED 171, a green OLED 172, and a blue OLED 173, respectively. The OLED materials that emit different colors of light are separately formed through the evaporation process by using the FMM process, which can directly realize color display, thereby reducing the disposing of color filter layers, reducing the overall thickness of the display panel, and facilitating to achieve thinner and lighter devices. According to different display requirements, the OLED light emitting layer can also be set in different modes such as RGB, RGGB, RGBW and so on. In the same sub-pixel, the light emitting layer OLED film layers corresponding to a plurality of sub-pixel-units are continuously arranged, and the colors of the light emitted by the plurality of sub-pixel-units are the same.

The light emitting device may include functional film layers such as an electron transport layer (ETL), an electron injection layer (EIL), a hole transport layer (HTL), and a hole injection layer (HIL) in addition to the light emitting layer to adjust the injection balance of electrons and holes, improve luminous efficiency, and improve the performance of light emitting devices.

Optionally, the display panel includes a cathode 115 disposed on a side of the light emitting layer 170 facing away from the base substrate. The cathode 115 may be formed through an entire-surface evaporation process or a sputtering process. In the same sub-pixel, cathode film layers corresponding to a plurality of sub-pixel-units are continuously arranged. The cathode film layers of different sub-pixels may be continuously arranged as shown in FIG. 1 or may be disconnected at the pixel defining layer 116 as shown in FIG. 3. The cathode 115 may be made of materials such as metals or transparent conductive oxides, such as transparent metal oxide materials such as ITO, IZO, ITO/Ag/ITO, or transparent metal materials such as Ag, Mg, and Mg/Ag alloys. The present disclosure does not limit the material and thickness of the cathode.

Optionally, the display panel includes an encapsulation layer 113 disposed on a side of the cathode 115 facing away from the base substrate. The encapsulation layer 113 is used to block moisture and oxygen in the air from entering the inside of the light emitting device, thereby extending the life of the light emitting device, and improving the reliability of the display panel. The encapsulation layer 113 may adopt inorganic materials or organic materials, or a mixed encapsulation film layer stacked by the inorganic material and the organic material, so as to achieve a better effect of blocking water and oxygen.

Figure 4:
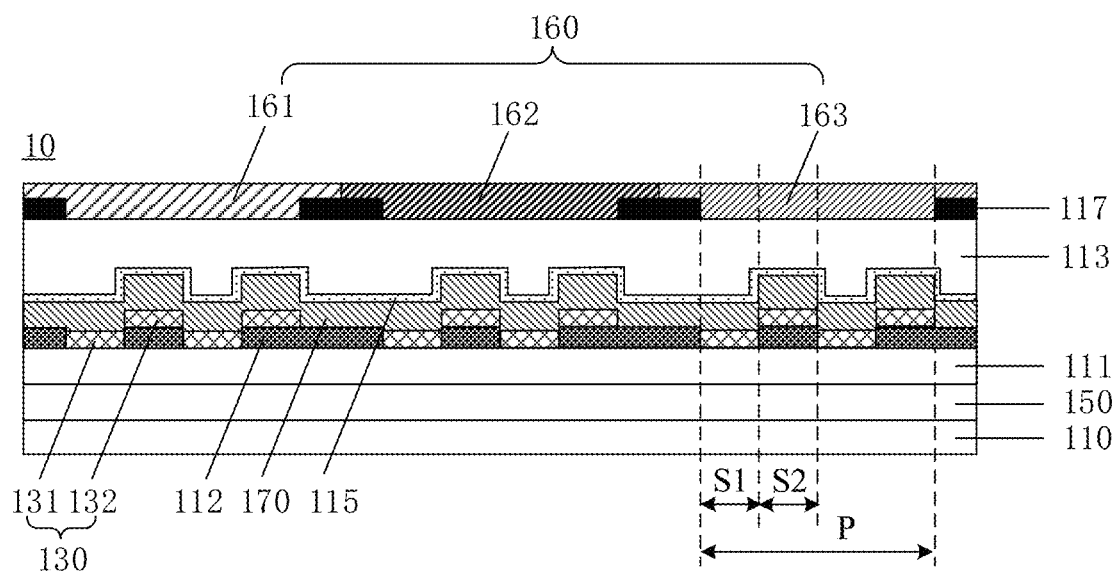
FIG. 4 is a cross-sectional view of a display panel provided by at least one embodiment of the present disclosure.

Optionally, as shown in FIG. 4, the display panel further includes a light shielding layer 117. The light shielding layer is disposed between adjacent sub-pixels P to avoid cross-coloring between adjacent sub-pixels and achieve a better display effect. In a case where the display panel is provided with the light-shielding layer 117, the pixel defining layer may not be provided, and the light-shielding layer 117 may be used to divide the display panel into a plurality of sub-pixels P. The light shielding layer 117 may be made of a black matrix or the like. The black matrix may be disposed on a side of the color filter layer 160 close to the base substrate 110, or on a side of the color filter layer 160 facing away from the base substrate 110. The position of the light-shielding layer is not limited herein.

Figure 5A:
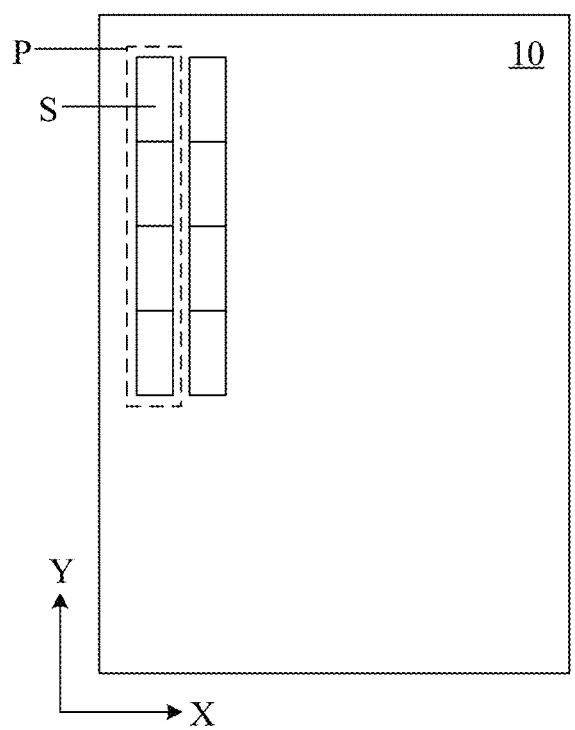
FIG. 5A is a top view of a display panel provided by at least one embodiment of the present disclosure.
Figure 5B:
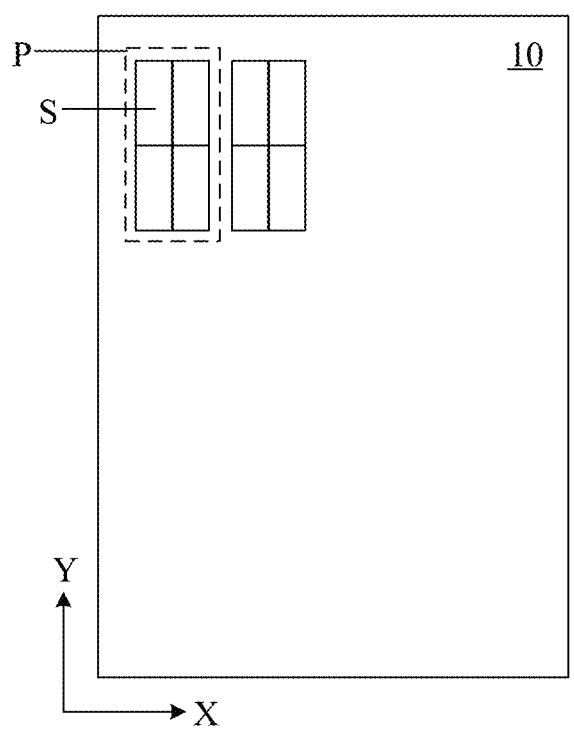
FIG. 5B is a top view of a display panel provided by at least one embodiment of the present disclosure.

The plurality of sub-pixel-units included in the same sub-pixel may have different arrangements in the sub-pixel. For example, as shown in FIGS. 5A and 5B, the display panel has a first direction X and a second direction Y, the first direction X and the second direction Y intersect. The same sub-pixel includes a*b sub-pixel-units, where "a" is the number of sub-pixel-units arranged along the second direction Y, and "b" is the number of sub-pixel-units arranged along the first direction X, and a≥2 and/or b≥2. That is, there are at least two sub-pixel-units in at least one direction in the sub-pixel. When the area of the sub-pixel is constant, the larger the values of "a" and "b," the higher the display PPI and the more delicate the display effect. As an example, when each sub-pixel P includes four sub-pixel-units S, as shown in FIG. 5A, the arrangement is a=4, b=1, that is, the four sub-pixel-units are arranged along the second direction Y; as shown in FIG. 5B, the arrangement is a=2 and b=2, that is, the four sub-pixel-units are arranged in an array.

The sub-pixel-units may have different shapes according to display design requirements. For example, the sub-pixel-units may be square, rectangular, diamond, or circular.

In the display panel of the present disclosure, distances between the anodes of adjacent sub-pixel-units and the base substrate are different, so that the mutual insulation of the adjacent sub-pixel-units is achieved. Thus, adjacent sub-pixel-units may be separated without providing a pixel defining layer or the like between adjacent sub-pixel-units, thereby reducing the spacing between adjacent sub-pixel-units and improving the display PPI.

Figure 6:
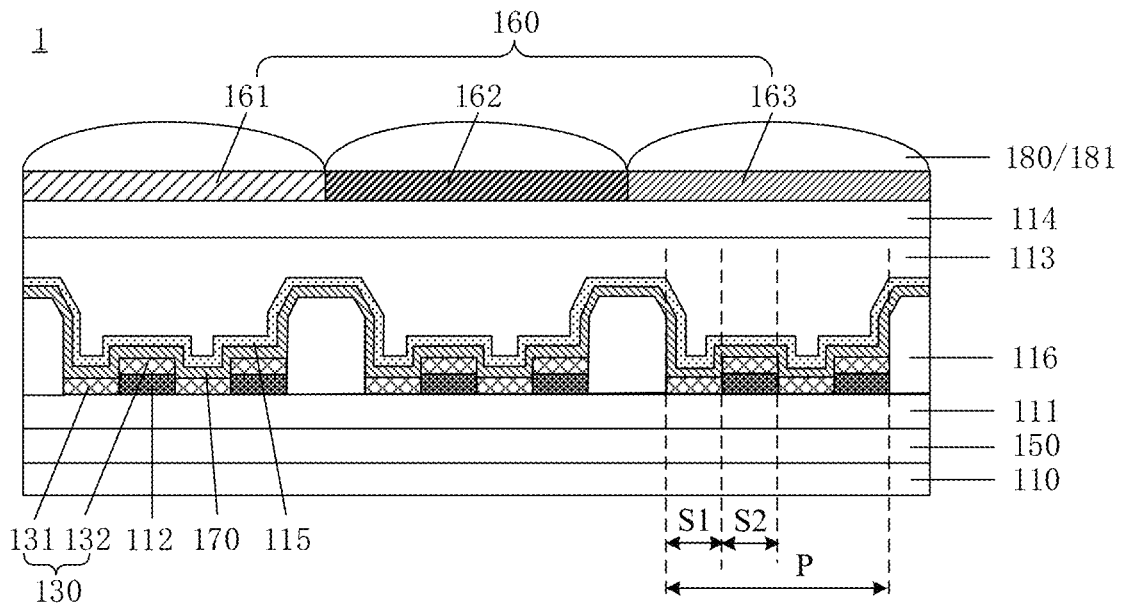
FIG. 6 is a cross-sectional view of a display device provided by at least one embodiment of the present disclosure.

The embodiments of the present disclosure further provide a display device 1. As shown in FIG. 6, the display device 1 includes the display panel 10 described in the above embodiments, and further includes a lens array 180 disposed on a light emitting side of the display panel 10. The lens array includes a plurality of lens units 181, and the lens units 181 have a one-to-one correspondence with the sub-pixels P in at least one direction. The lens units serve as light outputting directing devices, project the light emitted by corresponding sub-pixel-units to different positions in the space, and provide different images on the display panel for eyes of a user in front of the display device, thereby enabling the display device of the present disclosure to realize 3D display effect.

Figure 8A:
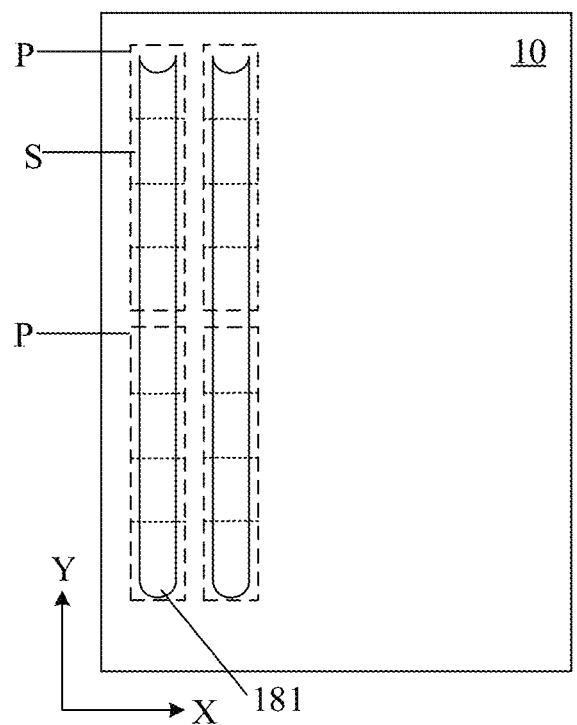
FIG. 8A is a top view of a display device provided by at least one embodiment of the present disclosure.

Optionally, as shown in FIG. 8A, a plurality of sub-pixels P are arranged in an array, and the plurality of lens units 181 of the lens array extend along the second direction Y of the display device, and are repeatedly arranged along the first direction X of the display device. Each lens unit 181 has a one-to-one correspondence with a plurality of sub-pixels P in its extending direction, that is, the lens units 181 have a one-to-one correspondence with the sub-pixels P in the first direction X. The Orthographic projection of the lens unit on the base substrate covers orthographic projections of the corresponding sub-pixels P on the base substrate. It can be understood that the sub-pixel P and the sub-pixel-unit S are located below the lens units 181, dashed lines in the schematic diagram 8A are used to indicate the sub-pixel P and the sub-pixel-unit S. For clarity, the dashed lines of the blocks of the sub-pixel P and the sub-pixel-unit S are set to be larger than the lens unit 181. In an actual solution, the orthographic projection of the lens unit 181 on the base substrate covers the orthographic projections of corresponding sub-pixels P on the base substrate. As an example, the lens unit may be a semi-cylindrical lens.

Figure 8B:
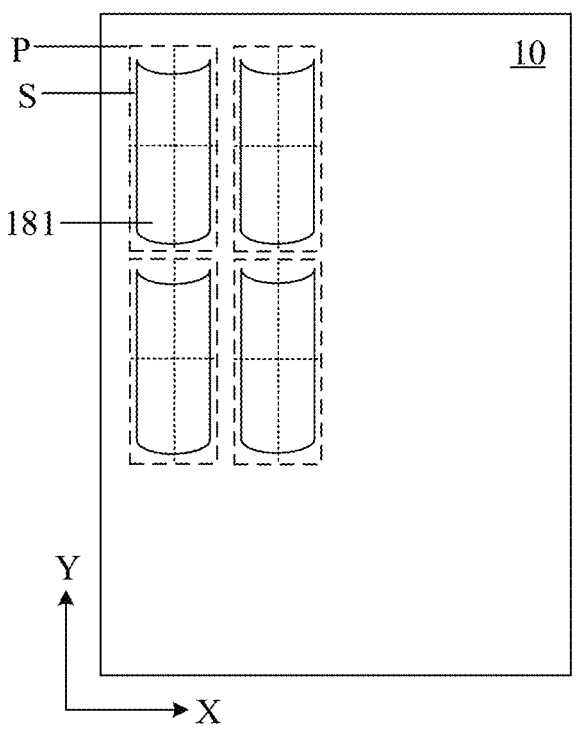
FIG. 8B is a top view of a display device provided by at least one embodiment of the present disclosure.

Optionally, as shown in FIG. 8B, the plurality of sub-pixels P are arranged in an array, and the plurality of lens units 181 of the lens array are also arranged in an array. The plurality of lens units 181 has a one-to-one correspondence with a plurality of sub-pixels P. The orthographic projection of the lens unit 181 on the base substrate covers the orthographic projection of the corresponding sub-pixel P on the base substrate. It can be understood that the sub-pixel P and the sub-pixel-unit S are located below the lens unit 181, the dashed lines in the schematic diagram 8B are used to indicate the sub-pixel P and the sub-pixel-unit S. For clarity, the dashed lines of the blocks of the sub-pixel P and the sub-pixel-unit S are set to be larger than the lens unit 181. In an actual solution, the orthographic projection of the lens unit 181 on the base substrate covers the orthographic projections of the corresponding sub-pixels P on the base substrate. As an example, in schematic diagram 8-2, the sub-pixel P has a rectangular shape, and the lens unit 181 may be a semi-cylindrical lens. When the sub-pixel P is square or circular, the lens unit 181 may also be a ball lens.

It is understandable that when each sub-pixel corresponds to one lens unit, all sub-pixel-units in each sub-pixel correspond to this lens unit. When one sub-pixel includes a*b sub-pixel-units ("a" is the number of sub-pixel-units arranged in the second direction Y, and "b" is the number of sub-pixel-units arranged in the first direction X), the display device has "a" fields of view in the second direction Y, and has "b" fields of view in the first direction X. That is, the more sub-pixel-units, the more fields of view in the corresponding direction, the more continuous the display screen. Further, continuous lobe angles can be formed on the extended viewing angles, thereby significantly increasing 3D viewing angles. Optionally, a≥9, b≥9. When the sub-pixel-units a and b corresponding to a lens are the same, the fields of view in the first direction and the second direction are the same. Optionally, a is equal to b. A pixel group of an autostereoscopic display device corresponds to each lens, the light of each pixel group forms a lobe, and when the light passes through the corresponding lens, a main lobe and a side lobe are formed, at the junction of the lobes, it is perceived that a stereo image is broken, and a wide lobe angle may reduce this phenomenon.

The current 3D display technology, when being applied to display products, has defects such as low PPI, low information amount (small number of views), and small 3D viewing angle. In the 3D display device provided by the embodiments of the present disclosure, distances between the anodes of adjacent sub-pixel-units and the base substrate are different to achieve the mutual insulation between adjacent sub-pixel-units, thereby reducing the spacing between adjacent sub-pixel-units and achieving the effect of improving PPI. Further, the number of sub-pixel-units corresponding to each lens unit determines the number of views displayed. The greater the number of sub-pixel-units, the greater the number of views, and the greater the viewing angle of the 3D display, thus, the 3D display device provided by the embodiments of the present disclosure improves the 3D display effect.

The 3D display principle of the embodiments of the present disclosure will be described below. Based on the visual difference between two eyes of the user and the principle of light refraction, the user is allowed to directly see a 3D stereoscopic image in a plane. The stereoscopic image is composed of two or more two-dimensional sub-image layers.

Figure 9:
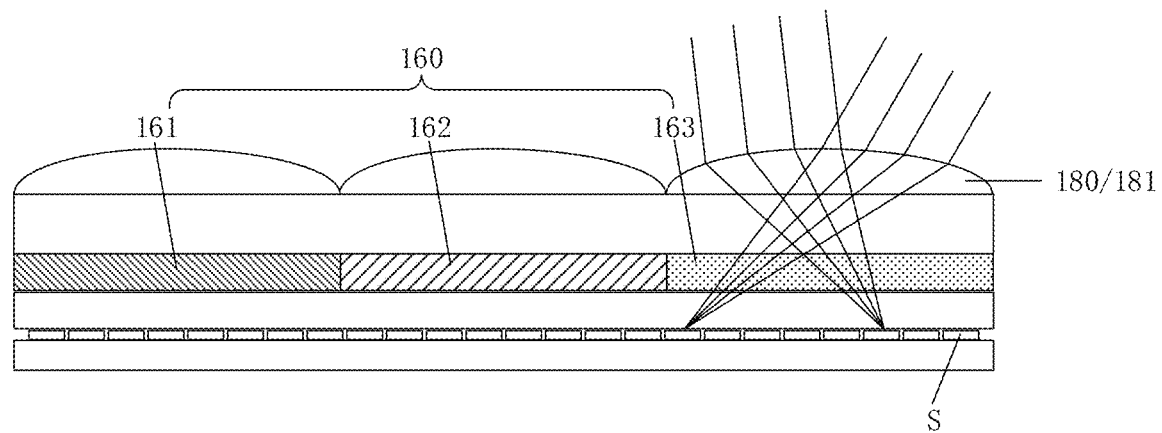
FIG. 9 is a schematic diagram of an operation principle of a lens unit of a display device provided by at least one embodiment of the present disclosure.
Figure 13:
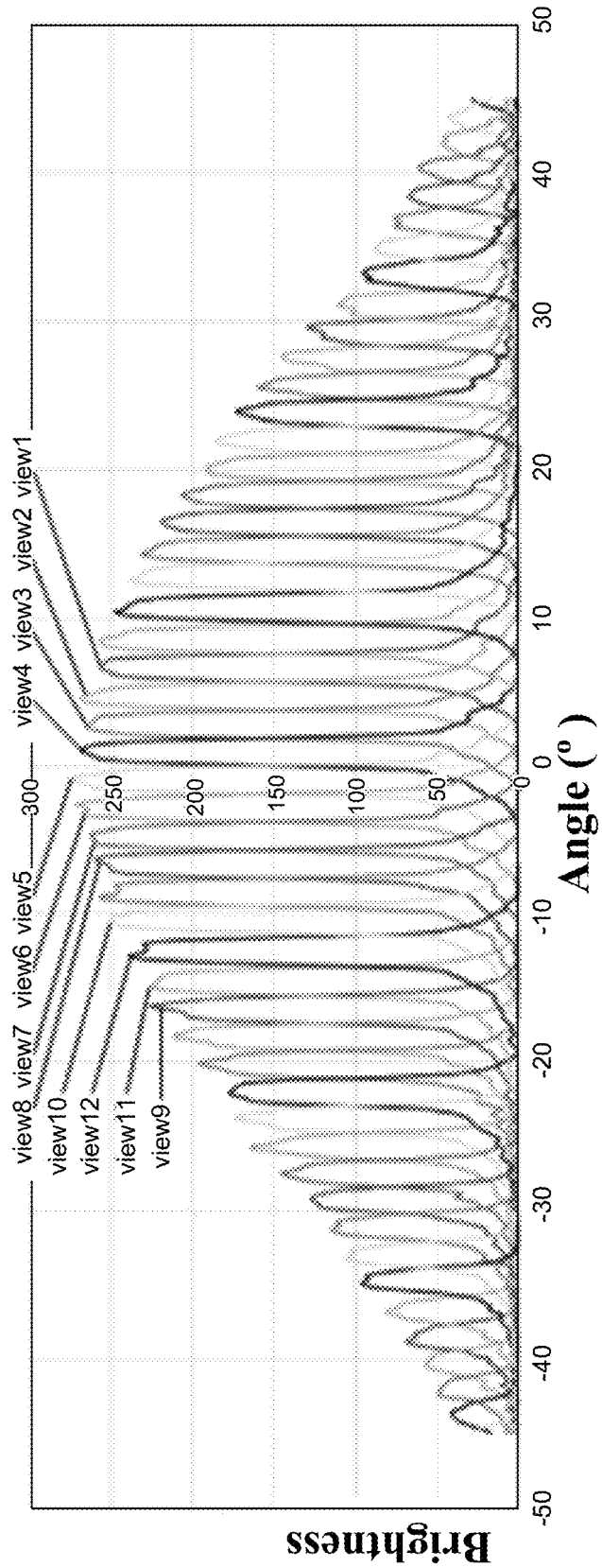
FIG. 13 is a 3D viewpoint brightness distribution graph of a display device according to at least one embodiment of the present disclosure as a viewing angle changes.
Figure 14:
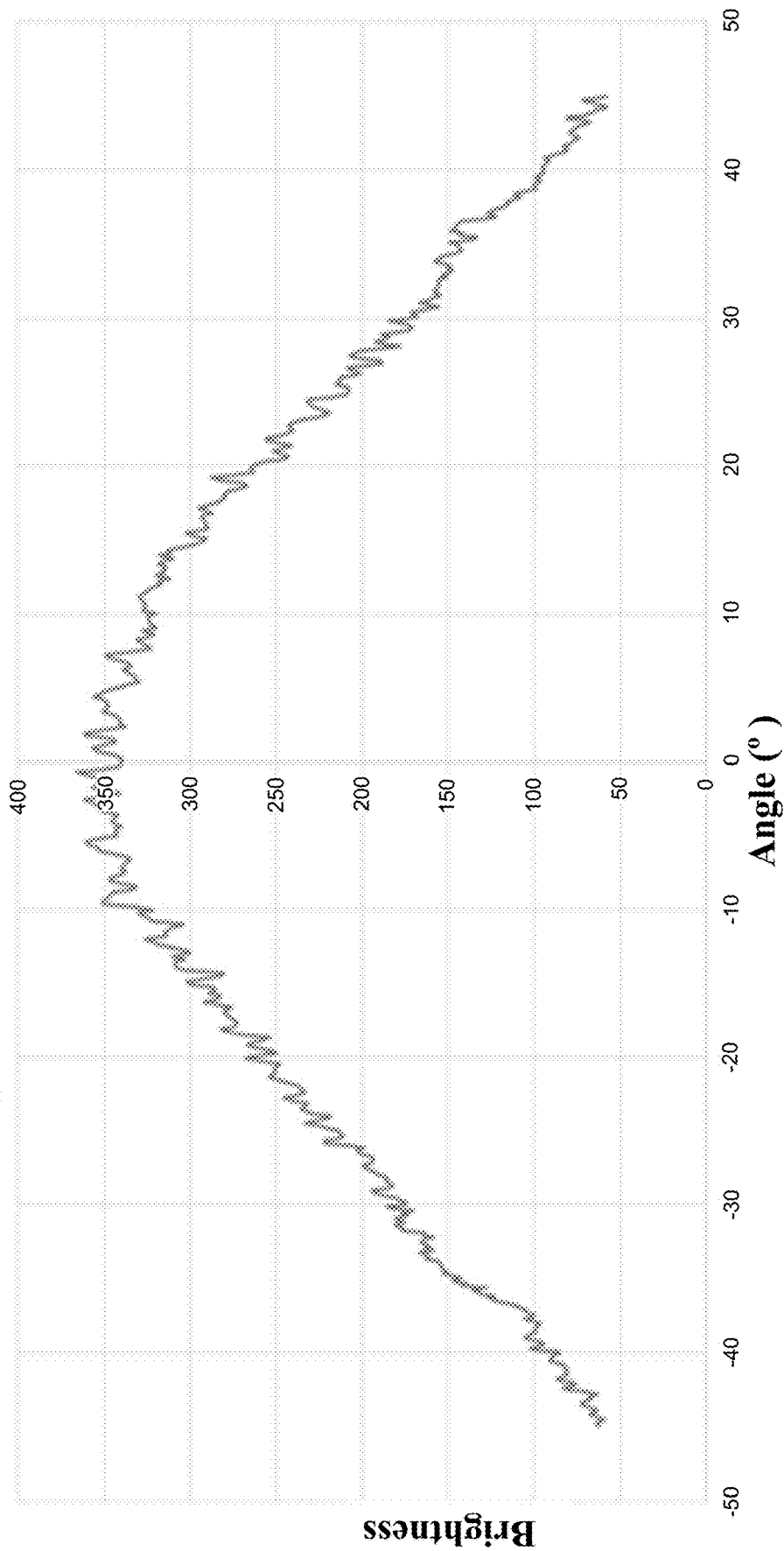
FIG. 14 is a 2D brightness distribution graph as a viewing angle changes.

The function of the lens unit is shown in FIG. 9. The light emitted by the sub-pixel-units is refracted by the lens to form a projection of approximately parallel light beams in space. As shown in FIGS. 13 and 14, the abscissa is the viewing angle, and the ordinate is the brightness value. FIG. 13 represents a brightness distribution of each 3D viewpoint varying with the viewing angle. FIG. 14 is a 2D brightness diagram varying with the viewing angle. In order to ensure that the projection of each sub-pixel-unit in the space does not interfere with each other and the view is continuous, it is necessary to make the sub-pixel-units continuously emit light as possible as shown in FIG. 13, that is, the spacing between the light emitting areas of the sub-pixel-units is close to zero. In this way, the moire pattern can be eliminated. When the user moves in the space, no alternate change between light and dark as shown in FIG. 14 appears in the image received from the display screen.

Figure 10A:
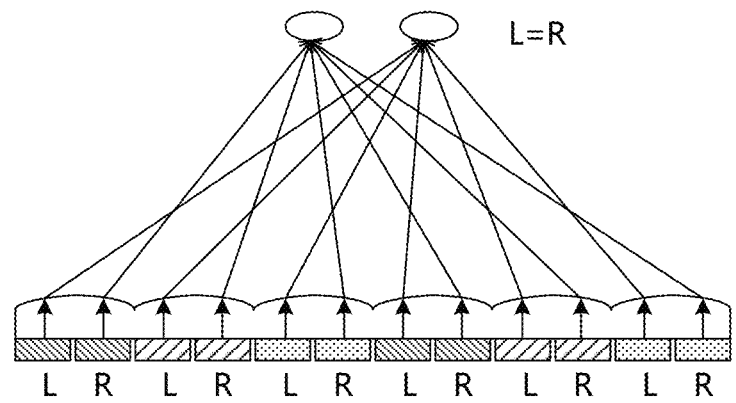
FIG. 10A is a schematic diagram of a principle of a 2D display implemented by a display device provided by at least one embodiment of the disclosure.
Figure 10B:
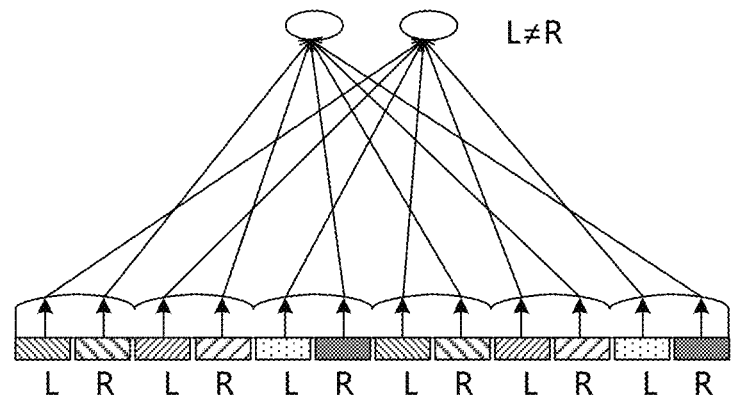
FIG. 10B is a schematic diagram of a principle of a 3D display implemented by a display device provided by at least one embodiment of the disclosure.

As shown in FIGS. 10A and 10B, the following situation is taken as an example: each lens unit corresponds to a column of sub-pixels, and a column of sub-pixels includes two columns of sub-pixel-units. Each column of sub-pixel-units provides a corresponding two-dimensional sub-image layer L or R, respectively, the lens unit orients these two image layers and the corresponding image layers from the sub-pixel-unit columns associated with other lens units to the left and right eyes of the user in front of the display panel, so that the user can observe a single stereoscopic image. As shown in FIG. 10-1, when the two-dimensional sub-image layers L and R are exactly the same, the user saw a normal two-dimensional image. As shown in FIG. 10B, when L and R are different two-dimensional sub-image layers, the user saw a stereo image combined by L and R.

When each lens unit is associated with a group of three or more adjacent sub-pixel-units in the row direction, the lens unit projects each sub-pixel-unit of a group in different directions, and orients to output them to different spatial positions. These positions all are in so-called viewing cones to form several different views, and repeating views in other viewing cones are produced by pixel light passing through adjacent lenses. Different sub-pixel-units in each group provide the corresponding two-dimensional sub-image layers. When the user's head moves from left to right, the user's eyes will receive different views of several views in sequence, perceiving a series of continuous, different, three-dimensional image.

Therefore, the number of sub-pixel-units corresponding to each lens determines the number of views displayed. The greater the number of sub-pixel-units, the greater the number of views, the more continuous the 3D display screen and the wider the angle of view.

In the display device of the embodiments of the present disclosure, distances between the anodes of adjacent sub-pixel-units and the base substrate are different so that adjacent sub-pixel-units are insulated from each other. Therefore, each sub-pixel-unit may be driven independently, and the spacing between the sub-pixel-units is reduced, thus the PPI is improved. Through the refraction of the lens, a 3D parallax is formed, so that the number of views provided by the 3D display device of the present disclosure is increased, thereby increasing the viewing angle Further, the spacing between the light emitting regions of the sub-pixel-units is close to zero, realizing continuous light emitting of the sub-pixel-units, and eliminating moire pattern and improving the 3D display effect.

For example, as shown in FIG. 6, the lens unit may be a plano-convex lens. A plane of the plano-convex lens is close to the display panel, and a convex surface of the plano-convex lens is away from the display panel.

Optionally, the light emitting layers of a plurality of sub-pixel-units are substantially located on focal planes of the lens units corresponding to the sub-pixel-units. When the light emitting layer is located substantially on the focal plane of its corresponding lens unit, the projections between respective viewpoints are approximately parallel light beams, and the crosstalk between them is very low.

A distance H between the light emitting layers of a plurality of sub-pixel-units and a surface of a corresponding lens unit close to the light emitting layers is:

$$H = n' \times f$$

where n' is an equivalent refractive index of a medium between the light emitting layers and its corresponding lens unit; f is a focal length of the lens unit, and f is:

$$\frac{1}{f} = (n-1)\left[\frac{1}{R1} - \frac{1}{R2} + \frac{(n-1)d}{n \cdot R1 \cdot R2}\right]$$

where n is a refractive index of the lens unit, R1 and R2 are radii of curvature of the two curved surfaces of the lens unit, respectively, and d is the thickness of the lens unit. It can be understood that the lens unit used in the present embodiment is a plano-convex lens, that is, R1 is infinity.

As shown in FIG. 6, in the embodiments of the present disclosure, the distances between the anodes of adjacent sub-pixel-units and the base substrate are different, and the distances between the light emitting layers of adjacent sub-pixel-units and the base substrate are also different. That is, the light emitting layers of a plurality of sub-pixel-units in the same sub-pixel are not in the same plane. Therefore, the light emitting layers of a plurality of sub-pixel-units being substantially located on the focal plane of the corresponding lens unit means that the light emitting layers of the sub-pixel-units are not required to be located on the focal plane of the lens unit exactly, there may be a certain deviation. The deviation range is related to the aperture of the lens, which may be $4.884\lambda(F/\#)^2$, $\lambda$ is the wavelength, F/# is the aperture, that is, the reciprocal of a relative aperture. That is, it is only required that the distance deviation between the light emitting layer and the focal plane of the lens unit is within the range of $4.88\lambda(F/\#)^2$.

As can be seen from FIG. 6, a difference of the distance between the light emitting layer 170 of a sub-pixel-unit and the base substrate relative to the distance between the light emitting layer of an adjacent sub-pixel-unit and the base substrate is approximately the thickness of the insulating layer 112. For example, the thickness of the insulating layer may be 1500 Å~3500 Å. As can be seen, the difference of the distance between the light emitting layer of a sub-pixel-unit and the base substrate relative to the distance between the light emitting layer of an adjacent sub-pixel-unit and the base substrate is within an acceptable deviation range, that is, the light emitting layers of the sub-pixel-units are substantially located on the focal plane of the lens units corresponding thereto, so as to reduce crosstalk between adjacent viewpoints.

Optionally, the orthographic projection of the lens unit on the base substrate substantially coincides with the orthographic projection of its corresponding sub-pixel. For example, the substantial coincidence means that the coincidence rate of the orthographic projection of the lens unit on the base substrate and the orthographic projection of its corresponding sub-pixel may be greater than or equal to 99.7%.

Optionally, as shown in FIG. 6, the lens array is located on the light emitting side of the display panel. The embodiments of the present disclosure do not limit the materials and manufacturing methods of the lens array, and it can be directly manufactured on the display panel 10 through the patterning process, or can be individually manufactured and then attached to the display panel through materials such as OCA (transparent optical glue). Illustratively, the lens array may be made of organic resin material and manufactured by a nano-imprinting process.

Optionally, as shown in FIG. 6, the display device may include a polarizer 114 arranged on the light emitting side of the display panel. The polarizer 114 is configured to prevent reflection of ambient light and reduce interference of external light on the display screen.

Optionally, as shown in FIG. 6, the light emitting layers of different sub-pixels are continuously provided, and the light emitting layer may be a white OLED. The sub-pixel-units are divided by different distances between the anodes and the base substrate, and it can achieve the manufacturing of 3D display devices with very high PPIs. Compared with the OLED display panel manufactured in the FMM manner, it is not limited by the pixel defining layer, which can greatly increase the 3D viewing angle and connect the main lobe angle to the multi-level lobe angles, and can be more suitable for the 3D display solution of a medium and large-sized OLED panel.

Figure 7:
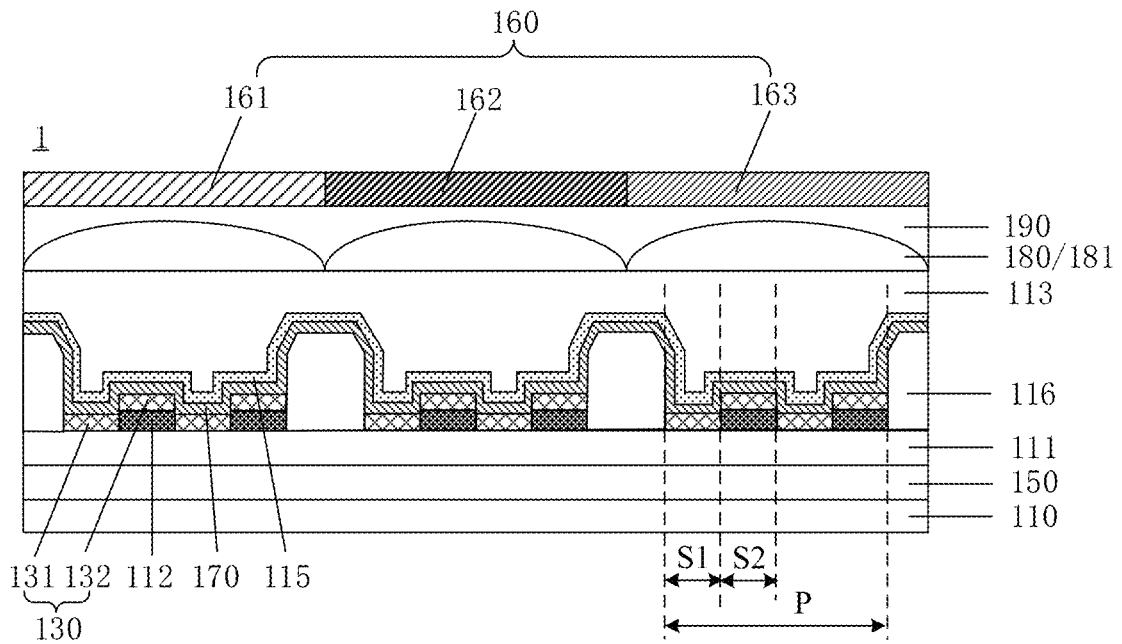
FIG. 7 is a cross-sectional view of a display device provided by at least one embodiment of the present disclosure.

Optionally, as shown in FIG. 7, when the display panel is provided with a color filter layer 160, the lens array 180 may also be located on the side of the color filter layer 160 close to the base substrate. A buffer layer 190 is provided between the lens array 180 and the color filter layer 160. The function of the buffer layer 190 is to improve the flatness of the surface of the lens array 180 and to protect the lens array 180 to prevent wear on the lens array surface. The refractive index of the buffer layer 190 is smaller than that of the lens array 180.

In the display device of the embodiments of the present disclosure, the adjacent sub-pixel-units are insulated from each other due to different distances between the anodes of the adjacent sub-pixel-units and the base substrate, so that each sub-pixel-unit is driven independently, the spacing between the sub-pixel-units is reduced, and the PPI is improved. Through the refraction of the lens, a 3D parallax is formed, so that the number of views provided by the 3D display device of the present disclosure is increased, the viewing angle is increased. Further, the spacing of the light emitting regions of the sub-pixel-units is close to zero, realizing continuous light emitting of the sub-pixel-units, and eliminating moire pattern and improving the 3D display effect.

The present disclosure further provides a control method of a display device, including:
providing a same electrical signal to all sub-pixel-units in each sub-pixel to enable a display panel to implement 2D display; and
providing different electrical signals to all sub-pixel-units in each sub-pixel to enable the display panel to implement 3D display.

The embodiments of the present disclosure may realize a switching between 2D display and 3D display by controlling the electrical signal of the sub-pixel-units in each sub-pixel.

Illustratively, each sub-pixel-unit is controlled by a separate thin-film transistor, and different driving voltages are provided to the anodes of the sub-pixel-units to switch between the 2D display and the 3D display. When the anodes of all sub-pixel-units in each sub-pixel are provided with the same driving voltage, the gray levels of all sub-pixel-units are the same, and the display panel implements the 2D display. When the anodes of all sub-pixel-units in each sub-pixel are provided with different driving voltages, the gray levels of all sub-pixel-units are different, and the display panel implements the 3D display.

The present disclosure further provides a method for manufacturing a display panel, including:
providing a base substrate;
manufacturing a pixel defining layer on the base substrate, and defining a plurality of sub-pixels by the pixel defining layer;
at least one sub-pixel of the plurality of sub-pixels includes a plurality of sub-pixel-units;
each of the sub-pixel-units in the plurality of sub-pixels includes an anode, a light emitting layer, and a cathode that are stacked. In the same sub-pixel, the anodes of adjacent sub-pixel-units are insulated from each other and apart from the base substrate for different distances.

Optionally, the method for manufacturing adjacent sub-pixel-units in the same sub-pixel whose anodes are insulated from each other and apart from the base substrate for different distances further includes:
the plurality of sub-pixel-units includes adjacent first and second sub-pixel-units, the first sub-pixel-unit includes a first anode, and the second sub-pixel-unit includes a second anode;
manufacturing an insulating layer, so that side walls of the first anode and side walls of the second anode are separated from each other by the insulating layer.

The method for manufacturing a display panel provided by the embodiments of the present disclosure is described in detail below.

Figure 11A:
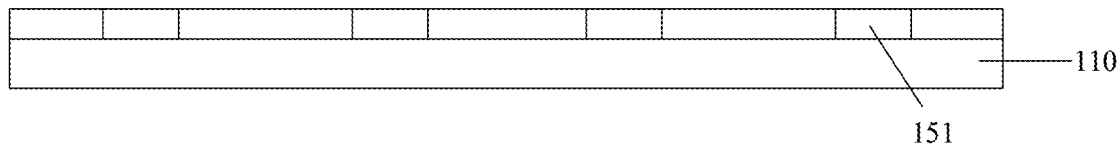
FIG. 11A is a schematic diagram of a manufacturing process of a thin film transistor provided by at least one embodiment of the present disclosure.

As shown in FIG. 11A, a base substrate is provided, and thin film transistors 151 are formed on the base substrate using a patterning process. Each thin film transistor may include structures such as an active layer, a gate, a source, and a drain. The forming process of each functional layer may include, for example, forming a material layer by sputtering or deposition, and patterning the material layer through a patterning process. The patterning process may include photoresist coating, exposure, development, and etching and the like. The embodiments of the present disclosure do not specifically limit the material and forming method of each functional layer.

Figure 11B:
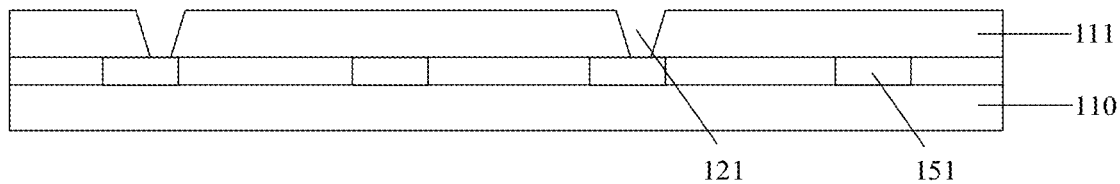
FIG. 11B is a schematic diagram of a manufacturing process of a flat layer provided by at least one embodiment of the present disclosure.

As shown in FIG. 11B, after the thin film transistors 151 are formed, a flat layer 111 may be formed on the side of the thin film transistors facing away from the base substrate, so that the flat layer 111 covers the thin film transistors 151. A first via 121 is formed in the flat layer 111, so that the source or drain of the thin film transistor is connected to other structures. The flat layer 111 may be made of an inorganic material or an organic material. The inorganic material may include silicon oxide, silicon nitride, or silicon oxynitride, and the organic material may include acrylic, polyimide, or the like. For example, when the flat layer 111 is made of the inorganic material, an inorganic material layer may be formed by deposition or the like, and then the inorganic material layer may be patterned using a photolithography process to form the first via 121. Alternatively, when the flat layer 111 is made of the organic material, an organic material layer may be first formed by a coating or spin coating method, and then the first via 121 is formed by processes such as exposure and development.

Figure 11C:
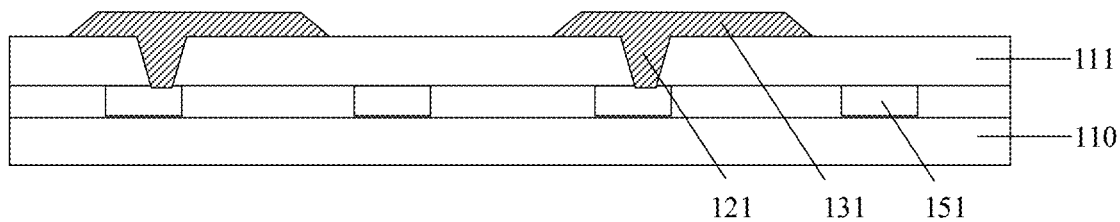
FIG. 11C is a schematic diagram of a manufacturing process of a first anode provided by at least one embodiment of the present disclosure.

As shown in FIG. 11C, after the flat layer 111 is formed, a first anode 131 is formed on the side of the flat layer facing away from the base substrate. The first anode 131 is connected to the source or drain of the thin film transistor 151 through the first via 121. For example, a conductive material layer is formed through deposition or sputtering and the like, and then the conductive material layer is patterned using a photolithography process to form the first anode 131. The first anode 131 is made of metals or transparent conductive oxides and the like, such as Ag, ITO, IZO, ITO/Ag/ITO and other materials.

Figure 11D:
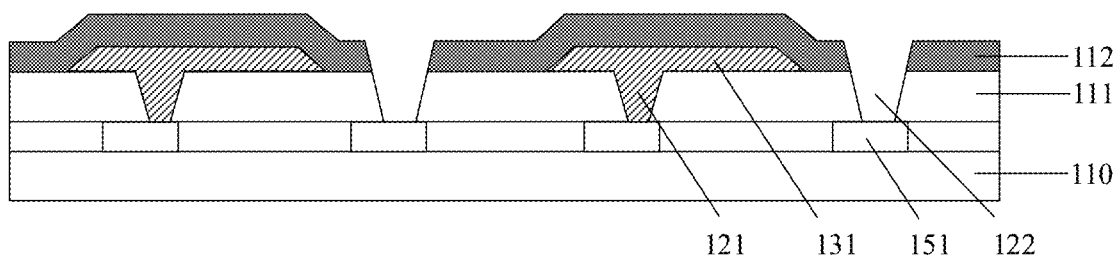
FIG. 11D is a schematic diagram of a manufacturing process of an insulating layer provided by at least one embodiment of the present disclosure.

As shown in FIG. 11D, after the first anode 131 is formed, the insulating layer 112 is formed, and a second via 122 is formed. The second via 122 penetrates through the insulating layer 112 and the flat layer 111. For example, an insulating material layer is first formed by using the method such as deposition or the like, and then the insulating material layer is patterned using a photolithography process to form the second via 122. The insulating layer 112 may use insulating materials such as silicon oxide, silicon nitride, or silicon oxynitride.

Figure 11E:
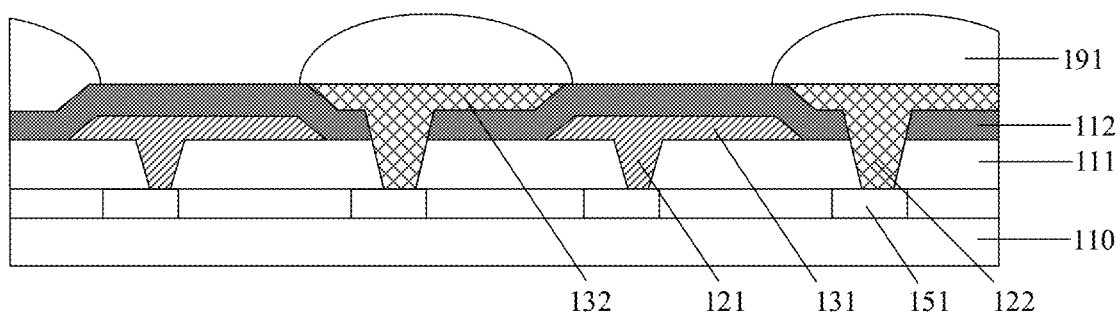
FIG. 11E is a schematic diagram of a manufacturing process of a second anode provided by at least one embodiment of the present disclosure.
Figure 11F:
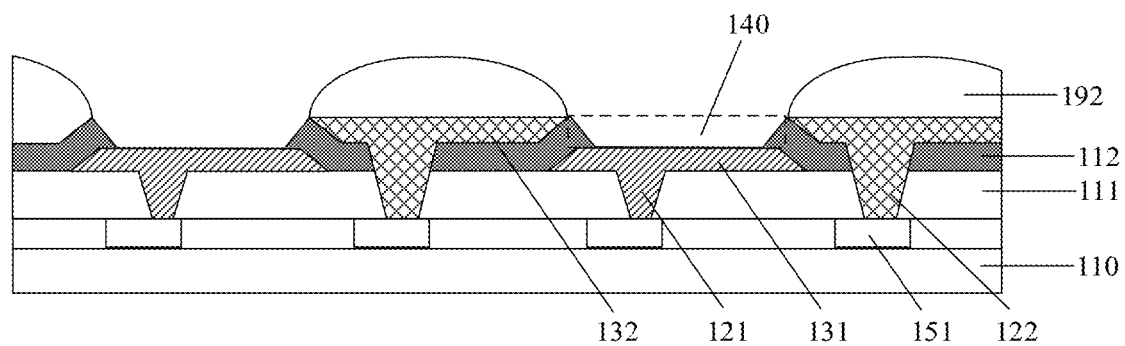
FIG. 11F is a schematic diagram of a manufacturing process of an opening region of an insulating layer provided by at least one embodiment of the present disclosure.
Figure 11G:
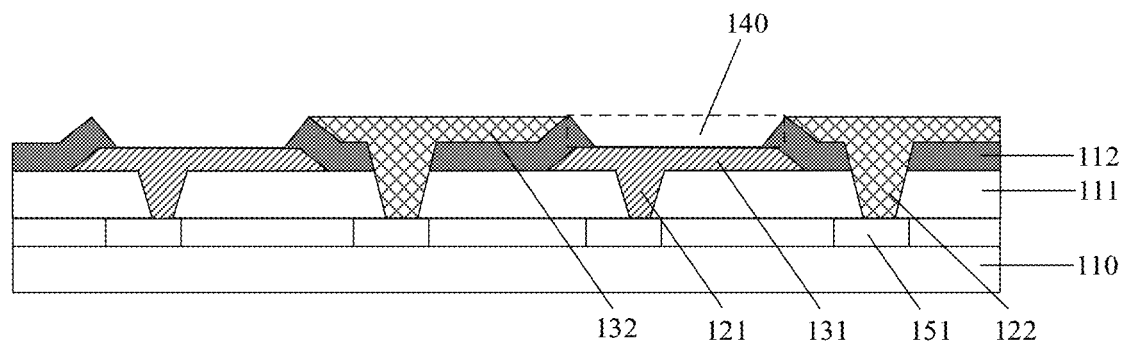
FIG. 11G is a schematic diagram of a manufacturing process of a display panel provided by at least one embodiment of the present disclosure.

As shown in FIG. 11G, after the insulating layer 112 is formed, a second anode 132 is formed on the side of the insulating layer 112 facing away from the base substrate, and the opening region 140 of the insulating layer 112 is simultaneously formed. The second anode 132 is connected to the source or drain of the thin film transistor 151 through the second via 122. For example, a conductive material layer is formed by using the method such as deposition or sputtering, and then the conductive material layer is patterned using a photolithography process to form the second anode 132 and the opening region 140 of the insulating layer 112. Specifically, photoresist is coated on the surface of the conductive material layer, and a photoresist retention region and a photoresist removal region are formed through a photolithography process. A first etching process is performed under the protection of the photoresist. The first etching process is used to etch the conductive material layer, and may use, for example, a wet etching. A suitable etching solution is selected according to the type of conductive material. After etching away the conductive material corresponding to the photoresist removal region, the pattern of the second anode 132 shown in FIG. 11E is obtained. After the first etching, the photoresist has the pattern 191 in the drawing. Then, under the protection of the photoresist 191, a second etching process is continued, and the insulating layer 112 is etched to form the pattern of the opening region 140. The second etching process may use, for example, a dry etching process. According to the type of the insulating layer material, appropriate gas is selected to etch the insulating layer. In the process of dry etching, the etching gas also has a certain corrosive effect on the photoresist. Therefore, while the insulating layer material is etched, the photoresist will also shrink accordingly, as shown in FIG. 11F, the finally formed photoresist pattern 192 corresponds to the opening size of the insulating layer. After the etching is completed, the remaining photoresist pattern 192 is stripped off. As shown in FIG. 11G, the opening region 140 of the second anode 132 and the insulating layer 112 are formed. The opening region 140 of the insulating layer 112 exposes the upper surface of the first anode 131. With the structure of the embodiment, the second anode 132 and the opening region 140 of the insulating layer is simultaneously formed by one patterning process, which reduces the process flow and lowers the production cost. The second anode is formed of materials such as metals or transparent conductive oxides, such as Ag, ITO, IZO, ITO/Ag/ITO and other materials. The materials of the first anode 131 and the second anode 132 may be the same, or different materials may be used.

Through the above processes in FIGS. 11-1 to 11-7, the anodes of adjacent sub-pixel-units that are insulated from each other and apart from the base substrate for different distances are formed.

For example, before the first anode 131 is formed, a pixel defining layer 116 is formed on the display panel, and the display panel is divided into a plurality of sub-pixels by the pixel defining layer 116. The pixel defining layer 116 may be formed after the second anode is formed. The pixel defining layer 116 may use the organic material, including acrylic, polyimide, and other materials. For example, an organic material layer is formed first by a coating or spin coating method, and then the pixel defining layer is formed by processes such as exposure and development.

As shown in FIG. 2, after the second anode 132 is formed, the structures of the light emitting device such as the light emitting layer 170 and the cathode 115 are formed. In the same sub-pixel, the light emitting layers 170 and the cathodes 115 of a plurality of sub-pixel-units are continuously arranged, and the light emitting layers 170 and the cathodes 115 of different sub-pixel-units may be continuously provided, or may be disconnected at the pixel defining layer 116. The light emitting layer 170 may use an organic light emitting material, and the cathode 115 and the anode 130 work together to drive the light emitting layer 170 to emit light. The organic light emitting material can be formed by, for example, evaporation. According to different device structures, corresponding white light OLED materials or different OLED materials such as red light, blue light, and green light are evaporated. The cathode 115 may use transparent metal oxide materials such as ITO and IZO, or may use transparent metal materials such as Ag, Mg and Mg/Ag alloys.

The present disclosure further provides a method for manufacturing a display device, including disposing a lens array on the light emitting side of the display panel as described above. The lens array may be directly manufactured on the light emitting side of the display panel by using a patterning process or a nano-imprinting process, and also can be attached to the light emitting side of the display panel through the adhesive material such as an optically clear adhesive (OCA) after being manufactured independently, which ensures the flatness and production quality of the lens array.

Figure 12A:
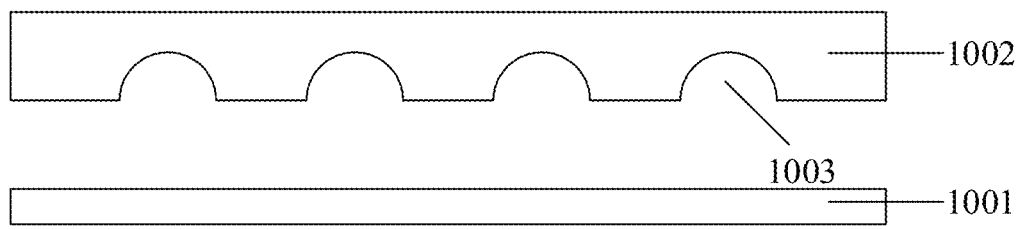
FIG. 12A is a schematic diagram of a manufacturing process of nano-imprinting provided by at least one embodiment of the present disclosure.

Optionally, the lens array in the embodiments of the present disclosure may be manufactured by a nano-imprinting process, including:

As shown in FIG. 12A, a base substrate 1001 and an imprinting template 1002 are provided. According to different device structures, when the lens array is directly manufactured on the display panel, the base substrate 1001 may be the display panel in the embodiment of the present disclosure. When the lens array is attached to the display panel in a bonding method, the base substrate 1001 may be an ordinary transparent substrate. The imprinting template 1002 has a periodic convex or concave structure. The schematic diagram takes the imprinting template 1002 having a periodic concave structure 1003 as an example.

Figure 12B:
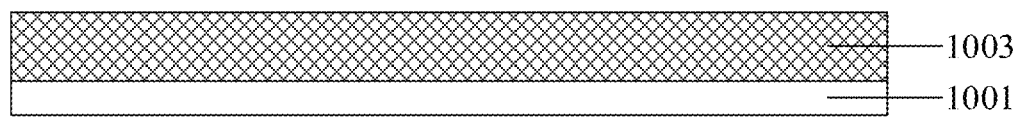
FIG. 12B is a schematic diagram of a manufacturing process of coating imprinting glue provided by at least one embodiment of the present disclosure.
Figure 12C:
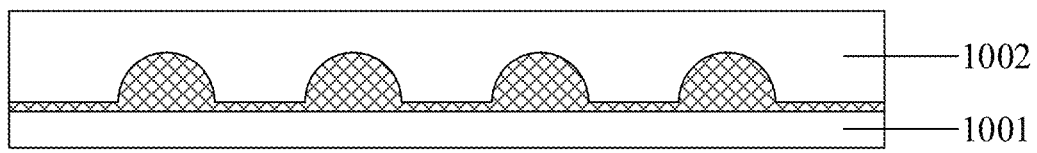
FIG. 12C is a schematic diagram of a manufacturing process of an imprinting process provided by at least one embodiment of the present disclosure.
Figure 12D:
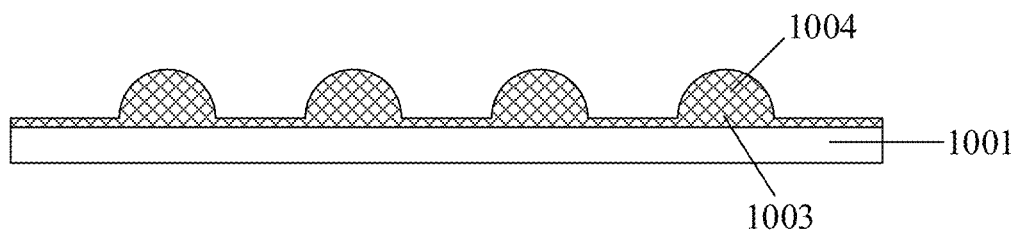
FIG. 12D is a schematic diagram of a manufacturing process of a lens array provided by at least one embodiment of the present disclosure.

As shown in FIG. 12B, imprinting glue 1003 is coated on the base substrate 1001, and the imprinting glue 1003 is imprinted by using the imprinting template 1002 and then demolded, so that the surface of the imprinting glue 1003 forms a concave or convex structure complementary to the pattern of the imprinting template. The schematic diagram takes the periodic convex structure 1004 formed on the surface of the imprinting glue 1003 as an example. The imprinting glue after being imprinted is irradiated with UV light for curing, and a lens array is obtained.

The scope of the present disclosure is not limited by the embodiments described above, but is limited by the appended claims and their equivalents.

What is claimed is:

1. A display panel, comprising:
   a base substrate;
   a pixel defining layer arranged on the base substrate and configured to define a plurality of sub-pixels, wherein:
   at least one sub-pixel of the plurality of sub-pixels includes a plurality of sub-pixel-units; and
   each of the sub-pixel-units of the plurality of sub-pixels comprises an anode, a light emitting layer, and a cathode that are stacked, and anodes of adjacent sub-pixel-units in a same sub-pixel are insulated from each other, and are apart from the base substrate for different distances,
   wherein the plurality of sub-pixel-units comprise a first sub-pixel-unit and a second sub-pixel-unit that are adjacent to each other, the first sub-pixel-unit comprises a first anode, and the second sub-pixel-unit comprises a second anode, and sidewalls of the first anode and sidewalls of the second anode are separated by an insulating layer, and
   wherein a spacing between orthographic projection of the first anode on the base substrate and orthographic projection of the second anode on the base substrate is less than zero, and
   wherein the display panel further comprises first and second thin film transistors disposed at a same layer between the base substrate and the first and second anodes, and a first via for connecting the first anode to the first thin film transistor and a second via for connecting the second anode to the second thin film transistor are configured to penetrate through different number of layers.

2. The display panel according to claim 1, further comprising a flat layer covering the first and second thin film transistors, wherein both the first via and the second via are configured to penetrate through the flat layer.

3. The display panel according to claim 2, wherein the insulating layer is at least partially located between the flat layer and the second anode, and the second via is configured to penetrate through the insulating layer while the first via does not perpetrate through the insulating layer.

4. The display panel according to claim 1, wherein light emitting layers of different sub-pixel-units in the same sub-pixel are continuously disposed.

5. The display panel according to claim 1, wherein cathodes of different sub-pixel-units in the same sub-pixel are continuously disposed.

6. The display panel according to claim 1, wherein light emitting layers of the plurality of sub-pixels are configured to emit white light, and a color filter layer is disposed on a light emitting side of the display panel.

7. The display panel according to claim 1, wherein light emitting layers of the plurality of sub-pixels are configured to emit red light, green light, and blue light, respectively.

8. The display panel according to claim 1, wherein in a thickness direction of the display panel, a lower surface of the insulating layer is in contact with an upper surface of the first anode, and a lower surface of the second anode is in contact with an upper surface of the insulating layer.

9. The display panel according to claim 1, wherein in a thickness direction of the display panel, wherein an upper surface of the first anode is smaller in area than a lower surface of the first anode, and an upper surface of the second anode is greater in area than a lower surface of the second anode.

10. A display device, comprising:
    a display panel and a lens array disposed on a light emitting side of the display panel, wherein the display panel comprises:
    a base substrate; and
    a pixel defining layer arranged on the base substrate and configured to define a plurality of sub-pixels, wherein:
    at least one sub-pixel of the plurality of sub-pixels includes a plurality of sub-pixel-units;
    each of the sub-pixel-units of the plurality of sub-pixels comprises an anode, a light emitting layer, and a cathode that are stacked, and anodes of adjacent sub-pixel-units in a same sub-pixel are insulated from each other, and are apart from the base substrate for different distances; and
    the lens array comprises a plurality of lens units, and each of the lens units corresponds to the plurality of sub-pixels,
    wherein the plurality of sub-pixel-units comprise a first sub-pixel-unit and a second sub-pixel-unit that are adjacent to each other, the first sub-pixel-unit comprises a first anode, and the second sub-pixel-unit comprises a second anode, and sidewalls of the first anode and sidewalls of the second anode are separated by an insulating layer, and
    wherein a spacing between orthographic projection of the first anode on the base substrate and orthographic projection of the second anode on the base substrate is less than zero, and
    wherein the display panel further comprises first and second thin film transistors disposed at a same layer between the base substrate and the first and second anodes, and a first via for connecting the first anode to the first thin film transistor and a second via for connecting the second anode to the second thin film transistor are configured to penetrate through different number of layers.

11. The display device according to claim 10, wherein each of the lens units corresponds to one of the plurality of sub-pixels.

12. The display device according to claim 11, wherein each of the plurality of lens units is ball lenses.

13. The display device according to claim 12, wherein distances H between the light emitting layers of the plurality of sub-pixel-units and the corresponding lens units are:

$$H = n' \times f$$

where n' is an equivalent refractive index of a medium between the light emitting layer and the corresponding lens unit; f is a focal length of the lens unit, and f satisfies:

$$\frac{1}{f} = (n-1)\left[\frac{1}{R1} - \frac{1}{R2} + \frac{(n-1)d}{n \cdot R1 \cdot R2}\right]$$

where n is a refractive index of the lens unit, R1 and R2 are radii of curvature of two curved surfaces of the lens unit, respectively, d is a thickness of the lens unit.

14. The display device according to claim 10, wherein orthographic projection of the lens unit on the base substrate substantially coincides with orthographic projection of the sub-pixels corresponding to the lens unit.

15. The display device according to claim 10, wherein the display device further comprises a color filter layer disposed on the light emitting side of the display panel, and the lens array is arranged on a side of the color filter layer facing away from the base substrate.

16. The display device according to claim 10, wherein the display device further comprises a color filter layer disposed on the light emitting side of the display panel, and the lens array is located on a side of the color filter layer close to the base substrate, and a buffer layer is disposed between the lens array and the color filter layer.

17. The display device according to claim 10, wherein the sub-pixel comprises a*b sub-pixel-units, where a is a number of sub-pixel-units arranged in a second direction, b is a number of sub-pixel-units arranged in a first direction, and a is equal to b.

18. The display device according to claim 10, wherein light emitting layers of the plurality of sub-pixel-units are located substantially on focal planes of the lens units corresponding to the sub-pixel-units.

19. A method for manufacturing a display panel, comprising:
   providing a base substrate; and
   manufacturing a pixel defining layer on the base substrate, and defining a plurality of sub-pixels by the pixel defining layer, wherein:
      at least one sub-pixel of the plurality of sub-pixels comprises a plurality of sub-pixel-units; and
      each sub-pixel-unit of the plurality of sub-pixels comprises an anode, a light emitting layer, and a cathode that are stacked, and anodes of adjacent sub-pixel-units in a same sub-pixel are insulated from each other, and are apart from the base substrate for different distances,
   wherein the plurality of sub-pixel-units comprise a first sub-pixel-unit and a second sub-pixel-unit that are adjacent to each other, the first sub-pixel-unit comprises a first anode, and the second sub-pixel-unit comprises a second anode, and sidewalls of the first anode and sidewalls of the second anode are separated by an insulating layer, and
   wherein a spacing between orthographic projection of the first anode on the base substrate and orthographic projection of the second anode on the base substrate is less than zero, and
   wherein the display panel further comprises first and second thin film transistors disposed at a same layer between the base substrate and the first and second anodes, and a first via for connecting the first anode to the first thin film transistor and a second via for connecting the second anode to the second thin film transistor are configured to penetrate through different number of layers.

20. The method for manufacturing a display panel according to claim 19, further comprising:
   providing first anodes;
   providing an insulating layer;
   providing a second anode material layer;
   coating photoresist to form a photoresist retention region and a photoresist removal region;
   performing a first etching process to etch away the second anode material corresponding to the photoresist removal region; and
   performing a second etching process to etch a portion of the insulating layer material corresponding to the photoresist removal region.

* * * * *